United States Patent
Park et al.

(10) Patent No.: US 10,923,613 B2
(45) Date of Patent: Feb. 16, 2021

(54) ENERGY HARVESTING APPARATUS HAVING LIGHT COLLECTING PARTICLES

(71) Applicants: Samsung Electronics Co., Ltd., Suwon-si (KR); RESEARCH & BUSINESS FOUNDATION SUNGKYUNKWAN UNIVERSITY, Suwon-si (KR)

(72) Inventors: Young-jun Park, Suwon-si (KR); Sang-woo Kim, Yongin-si (KR); Yun-kwon Park, Dongducheon-si (KR); Hong-joon Yoon, Goyang-si (KR); TaeYun Kim, Incheon (KR); Hyoungtaek Kim, Suwon-si (KR); Hye-jeong Park, Seoul (KR); Youngin Son, Suwon-si (KR); Wanchul Seung, Yongin-si (KR); Hanjun Ryu, Suwon-si (KR); Jeong Hwan Lee, Gumi-si (KR)

(73) Assignees: Samsung Electronics Co., Ltd., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 16/488,445

(22) PCT Filed: Jul. 18, 2017

(86) PCT No.: PCT/KR2017/007681
§ 371 (c)(1),
(2) Date: Aug. 23, 2019

(87) PCT Pub. No.: WO2018/155771
PCT Pub. Date: Aug. 30, 2018

(65) Prior Publication Data
US 2020/0006587 A1    Jan. 2, 2020

(30) Foreign Application Priority Data

Feb. 24, 2017 (KR) .................. 10-2017-0025023

(51) Int. Cl.
*H01L 31/054* (2014.01)
*G02B 19/00* (2006.01)
*H02N 1/04* (2006.01)

(52) U.S. Cl.
CPC ........ *H01L 31/054* (2014.12); *G02B 19/0009* (2013.01); *G02B 19/0042* (2013.01); *H02N 1/04* (2013.01)

(58) Field of Classification Search
CPC .................................................. H01L 31/055
See application file for complete search history.

(56) References Cited

U.S. PATENT DOCUMENTS 7,705,523 B2    4/2010  Wang et al.
10,103,648 B2   10/2018 Park et al.
(Continued)

FOREIGN PATENT DOCUMENTS

JP    2011-170034 A    9/2011
JP    2016-131249 A    7/2016
(Continued)

OTHER PUBLICATIONS

Korlacki et al.; Electrical control of photoluminescence wavelength from semiconductor quantum dots in a ferroelectric polymer matrix; University of Nebraska—Lincoln; DigitalCommons@University of Nebraska—Lincoln; Stephen Ducharme Publications; Research Papers in Physics and Astronomy; Applied Physics Letters 99, 153112 (2011); Oct. 2011; Nebraska.
(Continued)

*Primary Examiner* — Daniel P Malley, Jr.
(74) *Attorney, Agent, or Firm* — Jefferson IP Law, LLP

(57) ABSTRACT

An energy harvesting apparatus including light collecting particles is provided. The energy harvesting apparatus
(Continued)

includes a light collecting layer for collecting light incident thereon from the outside, a first charging member on a first surface of the light collecting layer, a second charging member on a surface of the light collecting layer opposite the first surface, and solar cells on opposite light exit surfaces between the first and second surfaces of the light collecting layer.

13 Claims, 5 Drawing Sheets

(56) References Cited

U.S. PATENT DOCUMENTS

2002/0018632 A1* 2/2002 Pelka ............... B82Y 30/00
385/130

2009/0317044 A1  12/2009  Buretea et al.
2013/0192664 A1   8/2013  Koole et al.
2015/0255657 A1   9/2015  Farahi

FOREIGN PATENT DOCUMENTS

KR  10-2016-0061267 A   5/2016
KR  10-2016-0098843 A   8/2016

OTHER PUBLICATIONS

International Search Report with Written Opinion and English translation dated Nov. 24, 2017; International Appln. No. PCT/KR2017/007681.

* cited by examiner

ENERGY HARVESTING APPARATUS HAVING LIGHT COLLECTING PARTICLES

TECHNICAL FIELD

Embodiments relate to an energy harvesting apparatus, and more particularly, to an energy harvesting apparatus for improving light emission characteristics of light collecting particles in a light collecting layer by applying an electric field generated by triboelectrification to the light collecting layer.

BACKGROUND ART

Recently, as there has been a growing interest in green energy, energy harvesting technology for using low ambient energy, such as heat, sun, vibration, etc., by converting the low ambient energy into electric energy is at issue. The energy harvesting technology is a new eco-friendly energy technology for converting mechanical energy generated due to vibration of humans or bridges or movements of humans or objects, solar energy, indoor light, and propagation of broadcasting radio waves into electrical energy. Although the amount of power that can be obtained by the energy harvesting technology is small, a device with low power consumption can be operated using only power obtained by energy harvesting without a separate external power source and thus a range of application of the energy harvesting technology is increasing. In particular, as wearable devices such as smart watches, which can be worn or put on a human body, have come into widespread use, the importance of the energy harvesting technology is increasing.

DESCRIPTION OF EMBODIMENTS

Technical Problem

Provided is an energy harvesting apparatus having light collecting particles, which is applicable to smartphones or wearable devices.

Solution to Problem

According to an aspect of the present disclosure, an energy harvesting apparatus includes a light guide plate configured to guide light incident thereon from the outside, the light guide plate including a plurality of light collecting particles; a first charging member on a first surface of the light guide plate; a second charging member on a second surface of the light guide plate; and solar cells on opposite light exit surfaces between the first and second surfaces of the light guide plate.

The first charging member and the second charging member may be configured to be charged by triboelectrification to apply an electric field to the light guide plate, and the plurality of light collecting particles may include a material, the excitation intensity of which is increased by an electric field.

For example, the plurality of light collecting particles may include organic dyes or quantum dots.

The light collecting particles may be configured such that an intensity of light emitted therefrom when the electric field is applied increases more than when no electric field is applied.

The light guide plate may be configured to transmit light satisfying a total reflection condition among the light emitted therefrom to edges of the light guide plate by total reflection.

The first charging member and the second charging member may include materials having different chargeabilities.

The first surface of the light guide plate may be a light-incident surface on which external light is incident. The first charging member may be formed of a transparent material.

The second charging member may be formed of a transparent material transmitting visible light.

The second charging member may be formed of a reflective material reflecting light incident thereon.

The energy harvesting apparatus may further include a third charging member configured to produce triboelectrification when brought into contact with the first charging member. The third charging member may include a material having a different chargeability from a chargeability of a material of the first charging member.

The third charging member may be configured to be separable from the first charging member, and connected to the ground while being separated from the first charging member.

The energy harvesting apparatus may further include a control circuit configured to adjust a current, voltage, and impedance of power to be transmitted from the solar cells to a power consumption device.

The energy harvesting apparatus may further include a transmission circuit configured to extract electric energy from the first charging member and the second charging member.

According to another aspect of the present disclosure, an energy harvesting apparatus includes a light guide plate configured to guide light incident thereon from the outside, the light guide plate including a plurality of light collecting particles; a first charged body on a first surface of the light guide plate; a second charged body on a second surface of the light guide plate; and solar cells on opposite light exit surfaces between the first and second surfaces of the light guide plate.

The first charged body may be charged to have a first electric polarity. The second charged body may be charged to have a second electric polarity opposite the first electric polarity. An electric field may be continuously applied to the light guide plate by the first and second charged bodies.

For example, the first charged body and the second charged body may include a ferroelectric material or an electret material.

The first charged body may include a dielectric material into which ions having a first electric polarity are implanted, and the second charged body may include a dielectric material into which ions having a second electric polarity are implanted.

According to another aspect of the present disclosure, a power consumption device includes an energy harvesting apparatus configured as described above.

Advantageous Effects of Invention

According embodiments set forth herein, light energy to be delivered to a solar cell may be increased by applying an electric field to light collecting particles in a light collecting layer by using electric energy generated by friction or the like. Thus, an energy harvesting apparatus according to an embodiment is capable of efficiently harvesting light energy emitted, for example, from indoor light. When the energy harvesting apparatus is installed in a portable device, the portable device may be continuously charged with energy.

MODE OF DISCLOSURE

Figure 1:
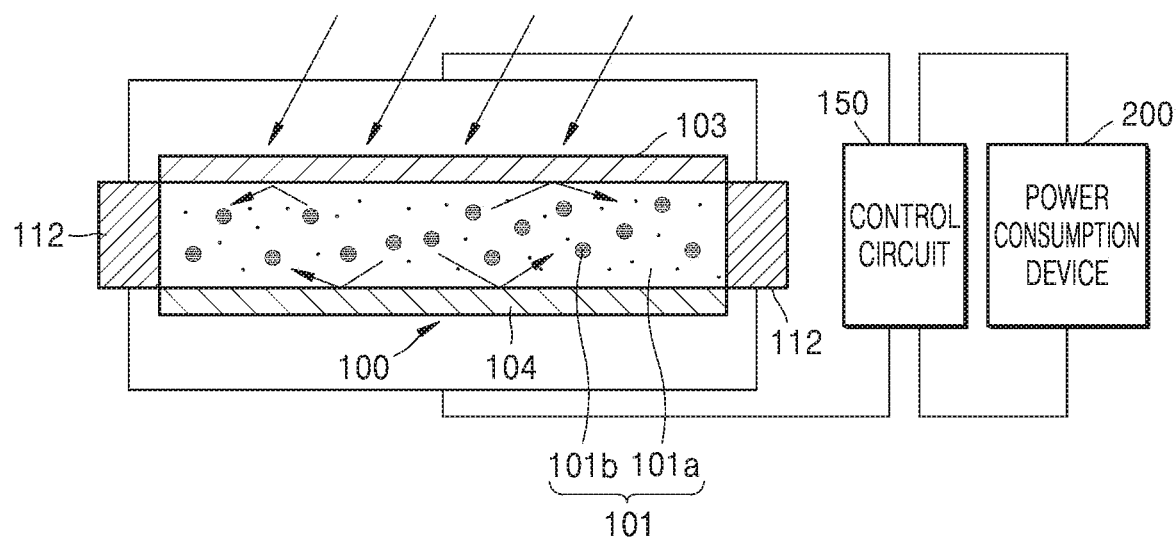
FIG. 1 is a schematic cross-sectional view illustrating a structure of an energy harvesting apparatus according to an embodiment.

Hereinafter, an energy harvesting apparatus having light collecting particles will be described in detail with reference to the accompanying drawings. In the drawings, like reference numerals refer to like elements, and the size of each element may be exaggerated for clarity and convenience of description. Embodiments described below are merely examples and various modifications may be made therein. As used herein, the term "on" or "above" a layer structure may be understood to mean that an element can be directly on another element or be on another element not in contact with the other element.

FIG. 1 is a schematic cross-sectional view illustrating a structure of an energy harvesting apparatus according to an embodiment. Referring to FIG. 1, an energy harvesting apparatus 100 according to an embodiment may include a light collecting layer 101 which absorbs light incident thereon from the outside and transmits the absorbed light toward an edge thereof, a first charging member 103 on a first surface of the light collecting layer 101, a second charging member 104 on a second surface of the light collecting layer 101 opposite the first surface, and solar cells 112 on sides between the first and second surfaces of the light collecting layer 101. The energy harvesting apparatus 100 may further include a control circuit 150 capable of adjusting a current, voltage, or the like of power supplied from the solar cells 112 to a power consumption device 200.

The light collecting layer 101 may include a light guide plate 101a formed of a transparent material which transmits light therethrough, and a plurality of light collecting particles 101b dispersed in the light guide plate 101a. The light guide plate 101a may be formed of a transparent material having a high refractive index so that light may be transmitted therethrough by total reflection. In addition, the light guide plate 101a may be formed of a flexible polymer material that easily warps or is easily bendable, so that the energy harvesting apparatus 100 may be mounted on a wearable device. For example, the light guide plate 101a is formed of a material, such as polycarbonate (PC), polyethylene terephthalate (PET), poly methyl methacrylate (PMMA), triacetyl cellulose (TAC), poly acrylonitrile (PAN), or the like. Although FIG. 1 illustrates that the light guide plate 101a is merely thick for convenience of explanation, the light guide plate 101a may be a thin film having a small thickness of several mm or several hundred □m or less.

The light collecting particles 101b reflect light or absorb and emit light to be transmitted through the light guide plate 101a. Light incident on the light collecting particles 101b in the light guide plate 101a from the outside is reflected or absorbed and emitted from the light collecting particles 101b to spread into the light guide plate 101a. Light satisfying a total reflection condition determined by the light guide plate 101a among the light spreading into the light guide plate 101a propagates along the inside of the light guide plate 101a toward both side surfaces the light guide plate 101a. Thereafter, the light propagating along the inside of the light guide plate 101a is emitted to the outside of the light guide plate 101a via the side surface of the light guide plate 101a. Thus, the side surfaces of the light guide plate 101a may be light exit surfaces. According to the present embodiment, the light collecting particles 101b may be particles, the excitation intensity of which may be increased by an external electric field. For example, the light collecting particles 101b may include organic dyes for solar cells or quantum dots.

The quantum dots are particles having a certain size and a quantum confined stark effect, and may include compound semiconductors such as CdTe, CdSe, ZnS, CdS, or the like. For example, the quantum dots may have a diameter of about 1 nm to about 10 nm according to an inherent resonance wavelength thereof. Each of the quantum dots may be formed in a homogeneous single structure or a core-shell dual structure. Quantum dots of various core-shell structures have been proposed. For example, quantum dots of a structure such as CdSe/AsS, CdTe/CdSe, CdSe/ZnS or the like may be used. Here, an energy band gap of a shell material may be larger than that of a core material. When quantum dots are used as the light collecting particles 101b, quantum dots of various diameters may be dispersed in the light guide plate 101a to effectively absorb light of various wavelengths.

The solar cells 112 are provided on sides of the light guide plate 101a, and generate electric energy by receiving light transmitted from the light guide plate 101a. FIG. 1 illustrates that the solar cells 112 are provided on opposite sides of the light guide plate 101a to face each other. However, when the light guide plate 101a has, for example, a quadrangular shape, a total of four solar cells 112 may be provided on four sides of the light guide plate 101a to face one another. Because external light is collected using the light collecting layer 101 having a large area, concentrated by the light guide plate 101a having a thin thickness, and then supplied to the solar cells 112, light having an intensity sufficient to generate electric energy may be incident on the solar cells 112, for example, when indoor light is dark.

The first charging member 103 and the second charging member 104 may be provided on two opposite surfaces of the light guide plate 101a among remaining surfaces on which the solar cells 112 are not provided. For example, when the sides of the light guide plate 101a are light exit surfaces, the first charging member 103 and the second charging member 104 may be respectively provided on an upper surface and a lower surface of the light guide plate 101a. That is, the first charging member 103 and the second charging member 104 may be provided with the light exit surfaces therebetween. Here, the first charging member 103 on the upper surface of the light guide plate 101a and the second charging member 104 on the lower surface of the light guide plate 101a may be formed of materials having different chargeabilities to generate electric energy by triboelectrification.

For example, the first charging member 103 may be formed of a material that is more likely to be charged with positive (+) charges than a material of the second charging member 104, and the second charging member 104 may be formed of a material that is more likely to be charged with negative (−) charges than the material of the first charging member 103. Alternatively, the first charging member 103 may be formed of a material that is likely to be charged with negative (−) charges, and the second charging member 104 may be formed of a material that is likely to be charged with positive (+) charges. Whether each of the first charging member 103 and the second charging member 104 is to be charged with positive (+) or negative (−) charges may be determined by the difference between the chargeabilities of the first charging member 103 and the second charging member 104. In general, examples of the material that is likely to be charged with positive (+) charges include polyformaldehyde, polyvinyl alcohol (PVC), polyamide, etylcellulose (EC), silk, wool, paper, wood, cotton, steel, aluminum (Al), nickel (Ni), copper (Cu), silver (Ag), and the like. Examples of the material that is likely to be charged with negative (−) charges include silicone rubber, Teflon, polydimethylsiloxane (PDMS), Kapton, polypropylene (PP), polyethylene (PE), polyvinyl chloride (PVC), and the like.

When the first charging member 103 is provided on a light-incident surface of the light collecting layer 101, the first charging member 103 may be made of a transparent material which transmits light such as visible light. When the energy harvesting apparatus 100 is disposed and used, for example, on a display panel, the second charging member 104 may also be formed of a transparent material. However, when the energy harvesting apparatus 100 is used in the power consumption device 200 which does not need to transmit light, the second charging member 104 may be formed of an opaque material. In this case, the second charging member 104 may be formed of a reflective material, e.g., a metal, so that light passing through the light collecting layer 101 may be recycled.

When the first charging member 103 and the second charging member 104 are charged by frictional charging to generate electric energy, an electric field may be applied to the light guide plate 101a between the first charging member 103 and the second charging member 104. For example, FIGS. 2 and 3 are schematic cross-sectional views illustrating an operation of the energy harvesting apparatus 100 of FIG. 1.

Figure 2:
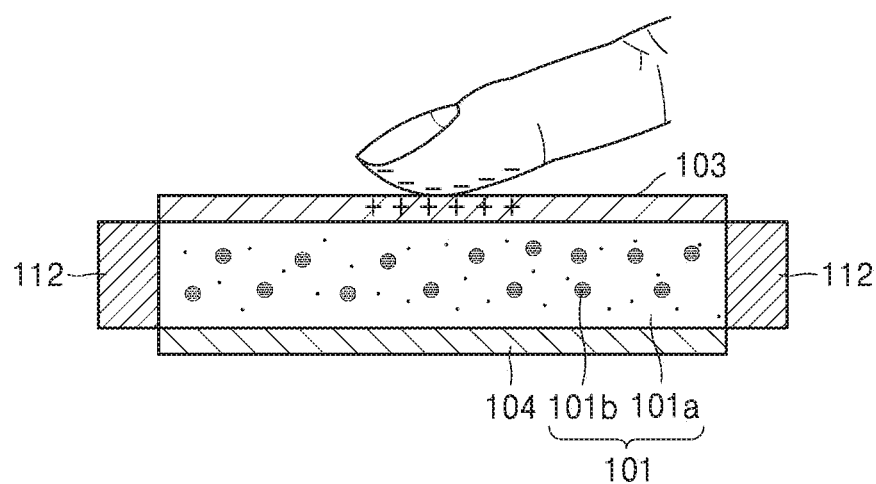
FIGS. 2 and 3 are schematic cross-sectional views illustrating an operation of the energy harvesting apparatus of FIG. 1.
Figure 3:
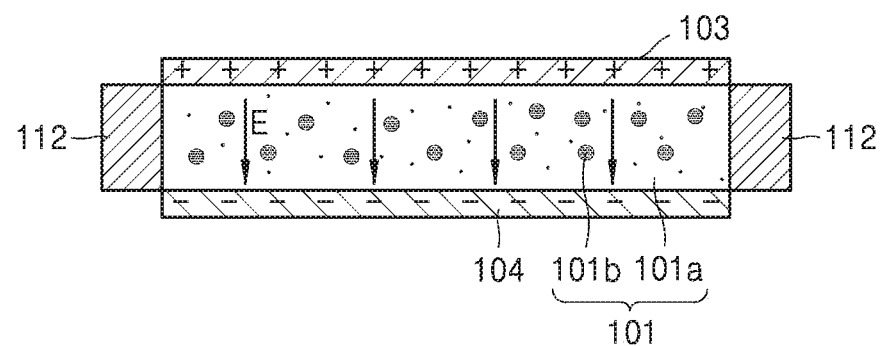

As illustrated in FIG. 2, when a human finger or an external object is brought into contact with the first charging member 103 to produce friction, for example, positive charges may move to the first charging member 103 and negative charges may move to the finger or the object. Thereafter, as illustrated in FIG. 3, when the finger or the object is separated from the first charging member 103, the first charging member 103 is charged with positive (+) charges. Thus, the second charging member 104 facing the first charging member 103 is charged with negative (−) charges. Therefore, an electric field E may be formed between the first charging member 103 and the second charging member 104. An intensity of the electric field E may vary depending on the difference between chargeabilities of the first charging member 103 and the second charging member 104 and the amount of charges moved by friction.

Figure 4:
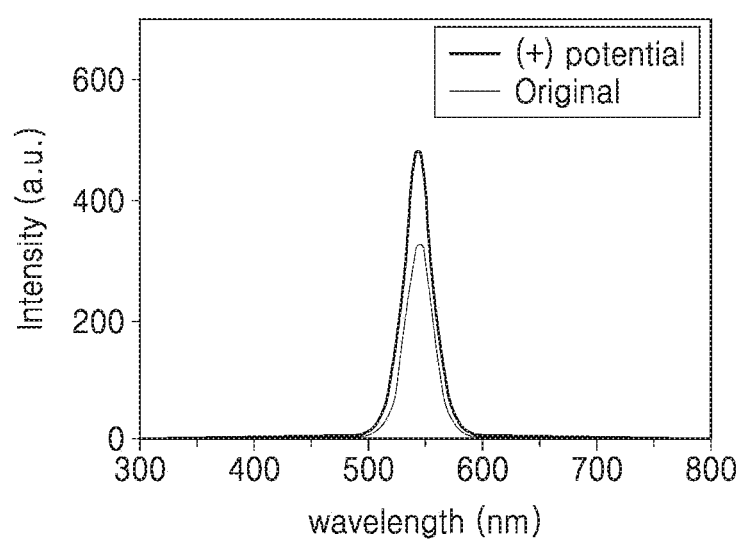
FIG. 4 is a graph showing the intensities of light incident on a solar cell before and after an electric field is applied.

Accordingly, an electric field may be applied to the light guide plate 101a between the first charging member 103 and the second charging member 104. Then, the light collecting particles 101b dispersed in the light guide plate 101a may be excited by the electric field. That is, the light collecting particles 101b absorb external light and thus are optically excited to emit light. When the electric field is applied to the light collecting particles 101b, an excitation intensity increases and thus the intensity of light emitted from the light collecting particles 101b may increase. Therefore, the intensity of light emitted from the light collecting particles 101b when the electric field is applied thereto increases more than when the electric field is not applied thereto. As a result, the intensity of light provided from the solar cells 112 may increase and thus the amount of electric energy generated by the solar cells 112 may increase. For example, FIG. 4 is a graph showing the intensities of light incident on the solar cell 112 before and after an electric field is applied. Referring to FIG. 4, the intensity of light incident on the solar cell 112 increased when an electric field was applied.

When the light collecting particles 101b are formed of quantum dots having the quantum confined stark effect, a band gap of the quantum dots, i.e., the light collecting particles 101b, is changed by an electric field applied to the light guide plate 101a. For example, as the intensity of the electric field increases, a wavelength absorbed by or emitted from the quantum dots moves toward a longer wavelength. A wavelength of light absorbed by or emitted from the light collecting particles 101b may be controlled using this phenomenon. For example, a user may intentionally produce triboelectrification between the first charging member 103 and the second charging member 104 or intentionally discharge the first charging member 103 and the second charging member 104, so that optimum light absorption may occur in the energy harvesting apparatus 100 according to the color of indoor light. For example, when the color of the indoor light is close to red, friction may be produced between a finger or another object and the first charging member 103. When the indoor light has a wavelength shorter than that of red, the first charging member 103 may be discharged by bringing a conductor such as a metal into contact with the first charging member 103.

According to the embodiment described above, the intensity of light emitted from the light collecting particles 101b may be increased by applying an electric field to the light collecting particles 101b in the light collecting layer 101 by using electric energy generated by triboelectrification. As a result, a ratio of total light energy supplied to the solar cells 112 from the light collecting layer 101 to total light energy of external light incident on the light collecting layer 101 may be improved. Therefore, light energy to be transmitted to the solar cells 112 may be increased and thus light energy emitted from, for example, indoor light may be efficiently harvested by the energy harvesting apparatus 100. Accordingly, the energy harvesting apparatus 100 according to the present embodiment does not need a bulky component, for maximum power point tracking, to obtain maximum power in a given environment and thus may be installed in a portable device to continuously supply power to the portable device.

Figure 5:
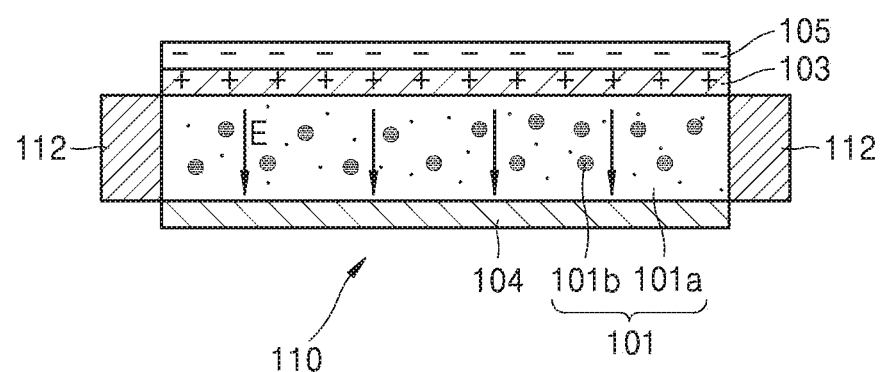
FIGS. 5 and 6 are schematic cross-sectional views illustrating a structure and operation of an energy harvesting apparatus according to another embodiment.
Figure 6:
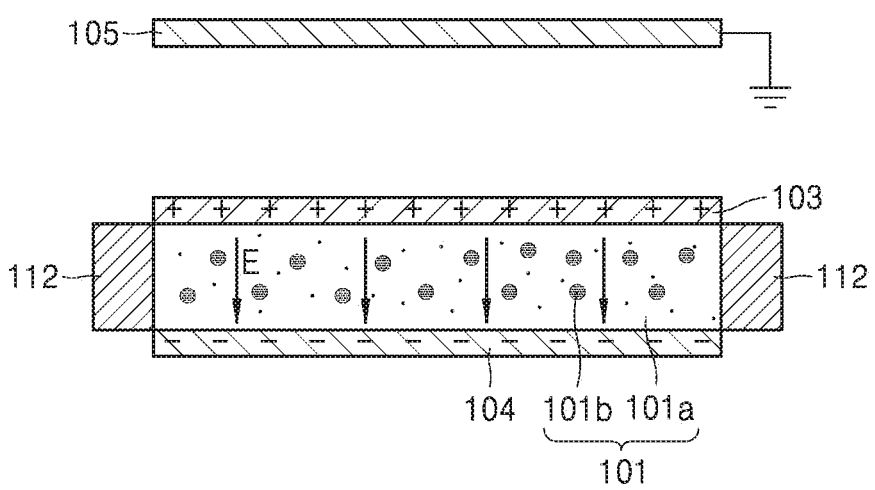

FIGS. 5 and 6 are schematic cross-sectional views illustrating a structure and operation of an energy harvesting apparatus 110 according to another embodiment. Referring to FIG. 5, the energy harvesting apparatus 100 may further include a third charging member 105 arranged to be contact with a first charging member 103. For example, when the first charging member 103 is formed of a material that is likely to be charged with positive (+) charges and a second charging member 104 is formed of a material that is likely to be charged with negative (−) charges, the third charging member 105 may be formed of a material that is likely to be charged with negative (−) charges. Conversely, when the first charging member 103 is formed of a material that is likely to be charged with negative (−) charges and the second charging member 104 is formed of a material that is likely to be charged with positive (+) charges, the third charging member 105 may be formed of a material that is likely to be charged with positive (+) charges. For example, the third charging member 105 may be formed of the same material as the second charging member 104, but is not necessarily limited thereto and may be formed of any material that satisfies the above-described condition.

The third charging member 105 produces triboelectrification when brought into contact with the first charging member 103. When the third charging member 105 is used, it is not necessary to intentionally bring a finger or another object into contact with the first charging member 103. Although FIG. 5 illustrates that the third charging member 105 is stacked on the first charging member 103, the third charging member 105 may not be fixed and may be configured to be movable freely on the first charging member 103. For example, a hinge or a string may be coupled only to one end of the third charging member 105.

As illustrated in FIG. 5, when the third charging member 105 is brought into contact with the first charging member 103 to produce friction, for example, positive charges may move to the first charging member 103 and negative charges may move to the third charging member 105. Thereafter, as illustrated in FIG. 6, when the third charging member 105 is separated from the first charging member 103, the first charging member 103 is charged with positive (+) charges. Thus, the second charging member 104 facing the first charging member 103 may be charged with negative (−) charges. Therefore, an electric field E may be formed between the first charging member 103 and the second charging member 104.

The third charging member 105 may be configured to be automatically connected to the ground when separated from the first charging member 103. Thus, the third charging member 105 may be discharged when separated from the first charging member 103. For example, the third charging member 105 may be configured to be connected to the ground, when the third charging member 105 is moved away from the first charging member 103 by a predetermined distance or more or is rotated by a certain angle or more about the axis of rotation of the hinge. Here, the ground may be the ground on a printed circuit board in the power consumption device 200 on which the energy harvesting apparatus 100 is mounted. Alternatively, the third charging member 105 may be configured to be naturally discharged while brought into contact with a part of the user's body or an external object.

Figure 7:
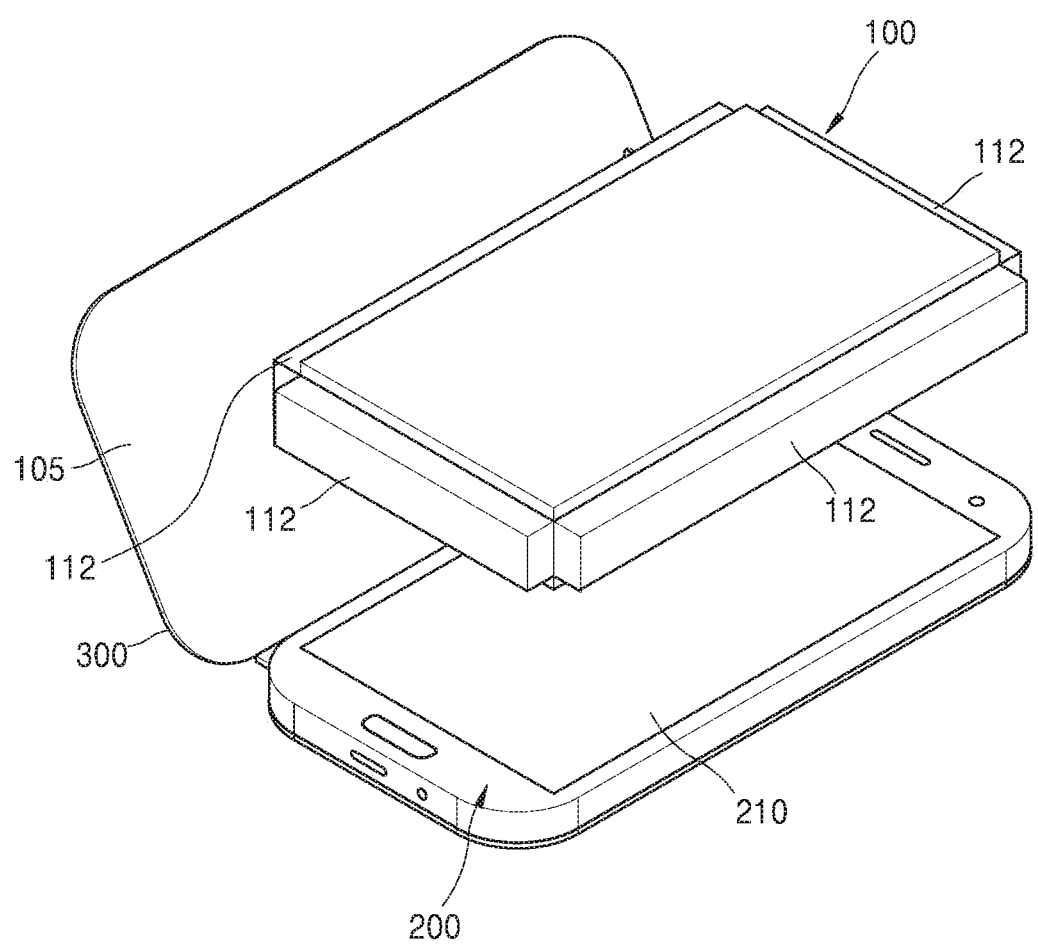
FIG. 7 is a perspective view illustrating an example in which the energy harvesting apparatus illustrated in FIGS. 5 and 6 is installed in a portable device.

FIG. 7 is a perspective view illustrating an example in which the energy harvesting apparatus 100 illustrated in FIGS. 5 and 6 is installed in a portable device, e.g., a power consumption device 200. For example, the power consumption device 200 may be a smartphone. As illustrated in FIG. 7, the energy harvesting apparatus 100 may be mounted on a display panel 210 of a smartphone. In this case, both the first charging member 103 and the second charging member 104 may be formed of a transparent material that transmits visible light. Solar cells 112 may be provided outside the smartphone but may be mounted inside the smartphone. In this case, an edge of a light collecting layer 101 may be inserted into the smartphone by bending the light collecting layer 101. The solar cells 112 may be directly connected to a power supply of the smartphone to supply power to the smartphone.

Because the first charging member 103 is exposed to the outside, the first charging member 103 may repeatedly come into contact a user's finger to produce triboelectrification while the smartphone is used by the user. Then, an electric field is applied to the light collecting layer 101 and thus light collecting efficiency of the light collecting layer 101 may be improved. The third charging member 105 may be placed on an inner side surface of a folder type cover 300 that accommodates the smartphone. In this case, the third charging member 105 may come into contact with the first charging member 103 to produce triboelectrification while the smartphone is not in use and thus the cover 300 is closed. Thereafter, when the user opens the cover 300 to use the smartphone, the third charging member 105 is separated from the first charging member 103 and thus an electric field may be applied to the light collecting layer 101.

Figure 8:
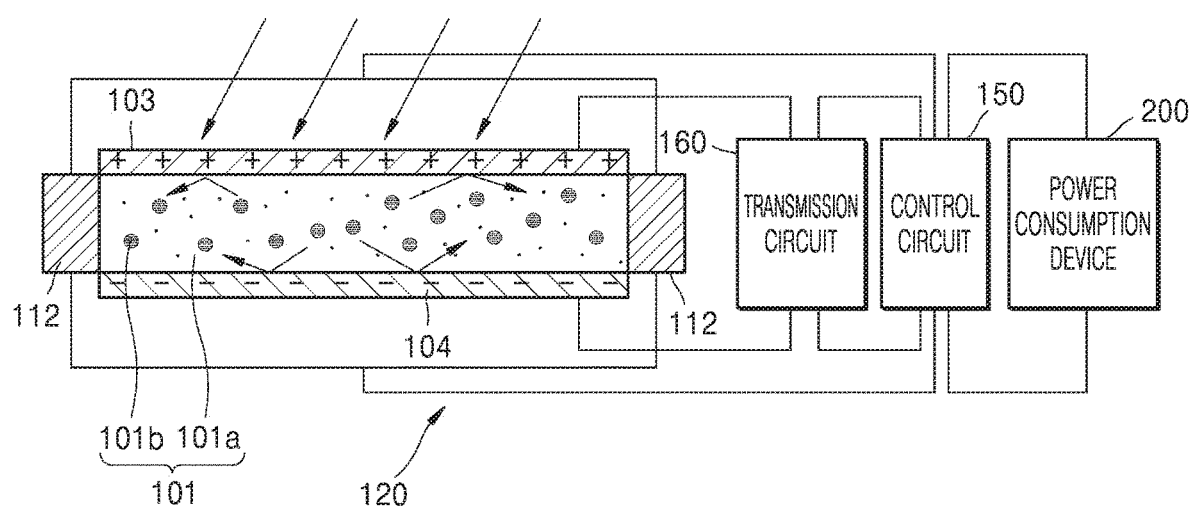
FIG. 8 is a schematic cross-sectional view illustrating a structure of an energy harvesting apparatus according to another embodiment.

FIG. 8 is a schematic cross-sectional view illustrating a structure of an energy harvesting apparatus 120 according to another embodiment. Referring to FIG. 8, the energy harvesting apparatus 120 may further include a transmission circuit 160 to extract electric energy from a first charging member 103 and a second charging member 104 which are charged. The transmission circuit 160 may include, for example, a converter (not shown) to convert an alternating-current (AC) electrical signal into a direct current (DC) voltage, and a step-down converter (not shown) to decrease the DC voltage converted from the AC electrical signal by the converter when the DC voltage is extremely high. The step-down converter is capable of protecting other devices by suppressing generation of excessive electrical signal. Therefore, the transmission circuit 160 converts an electrical signal generated by triboelectrification into an appropriate DC voltage. An output of the transmission circuit 160 may be transmitted to the control circuit 150 along with outputs of the solar cells 112 and then supplied to the power consumption device 200 via the control circuit 150. Although FIG. 8 illustrates the transmission circuit 160 and the control circuit 150 separately for convenience, the transmission circuit 160 and the control circuit 150 may be configured together on one circuit board or configured as one chip. The energy harvesting apparatus 120 of FIG. 8 may supply power by triboelectrification in a situation in which power cannot be supplied from the solar cells 112 because there is no external light.

Figure 9:
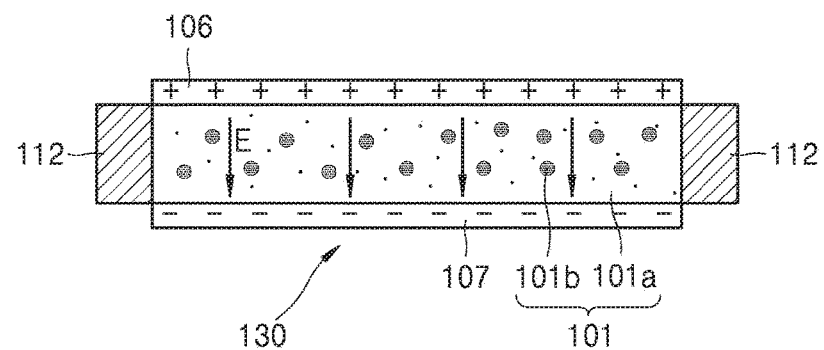
FIG. 9 is a schematic cross-sectional view illustrating a structure of an energy harvesting apparatus according to another embodiment.

FIG. 9 is a schematic cross-sectional view illustrating a structure of an energy harvesting apparatus 130 according to another embodiment. Referring to FIG. 9, the energy harvesting apparatus 130 may include a first charged body 106 and a second charged body 107 which are intrinsically charged to include positive charges or negative charges, instead of first and second charging members configured to produce triboelectrification. For example, the first charged body 106 containing positive charges may be provided on an upper surface of a light guide plate 101a instead of the first charging member 103, and the second charged body 107 containing negative charges may be provided on a lower surface of the light guide plate 101a instead of the second charging member 104. The first and second charged bodies 106 and 107 may be formed of, for example, a material such as ferroelectrics or electrets which may remain charged with positive (+) or negative (−) charges. Alternatively, the first charged body 106 and the second charged body 107 may be formed by an ion implantation method of forcibly injecting ions into a general dielectric material. For example, positive ions may be forcibly injected into the first charged body 106 and negative ions may be forcibly injected into the second charged body 107, or conversely, negative ions may be forcibly injected into the first charged body 106 and positive ions may be forcibly injected into the second charged body 107. When the first and second charged bodies 106 and 107 are respectively positioned on and below the light guide plate 101a, an electric field may be continuously applied to a light collecting layer 101 regardless of triboelectrification.

Energy harvesting apparatuses having light collecting particles according to embodiments have been described above and illustrated in the accompanying drawings to help understanding of the present invention. However, it should be understood that these embodiments are merely illustrative of the invention and thus the present invention is not limited thereto. In addition, it should be understood that the present invention is not limited to the matters described above and illustrated in the drawings. This is because various other modifications may be made by those of ordinary skill in the art.

The invention claimed is:

1. An energy harvesting apparatus comprising:
   a light guide plate configured to guide light incident from outside, the light guide plate including a plurality of light collecting particles;
   a first charging member on an upper surface of the light guide plate;
   a second charging member on a lower surface of the light guide plate; and
   solar cells on lateral surfaces of the light guide plate, the solar cells being configured to generate electrical energy based on light received from the light guide plate,
   wherein the first charging member and the second charging member are configured to be charged by triboelectrification and configured to apply an electric field to the light guide plate, and
   wherein an excitation intensity of the plurality of light collecting particles is increased by the electric field.

2. The energy harvesting apparatus of claim 1, wherein the plurality of light collecting particles comprise organic dyes or quantum dots.

3. The energy harvesting apparatus of claim 2,
   wherein the light collecting particles are configured such that an intensity of light emitted therefrom when the electric field is applied increases more than when no electric field is applied, and
   wherein the light guide plate is configured to transmit light satisfying a total reflection condition among the light emitted therefrom to edges of the light guide plate by total reflection.

4. The energy harvesting apparatus of claim 1, wherein the first charging member and the second charging member comprise materials having different chargeabilities.

5. The energy harvesting apparatus of claim 1,
   wherein the upper surface of the light guide plate is a light-incident surface on which external light is incident,
   wherein the first charging member is formed of a transparent material, and
   wherein the second charging member is formed of a transparent material transmitting visible light.

6. The energy harvesting apparatus of claim 1,
   wherein the upper surface of the light guide plate is a light-incident surface on which external light is incident,
   wherein the first charging member is formed of a transparent material, and
   wherein the second charging member is formed of a reflective material reflecting light incident thereon.

7. The energy harvesting apparatus of claim 1, further comprising:
   a third charging member configured to produce triboelectrification when brought into contact with the first charging member,
   wherein the third charging member comprises a material having a different chargeability from a chargeability of a material of the first charging member.

8. The energy harvesting apparatus of claim 7, wherein the third charging member is configured to be:
   separable from the first charging member, and
   connected to the ground while being separated from the first charging member.

9. The energy harvesting apparatus of claim 1, further comprising:
   a control circuit configured to adjust a current, voltage, and impedance of power to be transmitted from the solar cells to a power consumption device; and
   a transmission circuit configured to extract electric energy from the first charging member and the second charging member.

10. The energy harvesting apparatus of claim 1,
    wherein the first charging member comprises a first charged body charged to have a first electric polarity,
    wherein the second charging member comprises a second charged body charged to have a second electric polarity opposite the first electric polarity, and
    wherein the electric field is continuously applied to the light guide plate by the first and second charged bodies.

11. The energy harvesting apparatus of claim 10, wherein the first charged body and the second charged body comprise a ferroelectric material or an electret material.

12. The energy harvesting apparatus of claim 10,
    wherein the first charged body comprises a dielectric material into which ions having a first electric polarity are implanted, and
    wherein the second charged body comprises a dielectric material into which ions having a second electric polarity are implanted.

13. A power consumption device comprising the energy harvesting apparatus according to claim 1.

* * * * *